United States Patent
Iwashima et al.

(10) Patent No.: US 12,285,874 B2
(45) Date of Patent: Apr. 29, 2025

(54) COMPONENT MOUNTER

(71) Applicant: FUJI CORPORATION, Chiryu (JP)

(72) Inventors: Satoshi Iwashima, Chiryu (JP); Koji Kawaguchi, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 493 days.

(21) Appl. No.: 17/642,187

(22) PCT Filed: Sep. 11, 2019

(86) PCT No.: PCT/JP2019/035783
§ 371 (c)(1),
(2) Date: Mar. 10, 2022

(87) PCT Pub. No.: WO2021/048960
PCT Pub. Date: Mar. 18, 2021

(65) Prior Publication Data
US 2022/0297299 A1 Sep. 22, 2022

(51) Int. Cl.
*B25J 9/16* (2006.01)
*B25J 9/00* (2006.01)
(Continued)

(52) U.S. Cl.
CPC ........... *B25J 9/1687* (2013.01); *B25J 9/0096* (2013.01); *B25J 15/0057* (2013.01);
(Continued)

(58) Field of Classification Search
CPC ............. H05K 13/041; H05K 13/0411; H05K 13/0413; H05K 13/0812; H05K 13/0813;
(Continued)

(56) References Cited

U.S. PATENT DOCUMENTS

| 2009/0000110 A1* | 1/2009 | Maenishi | H05K 13/041 29/832 |
| 2016/0227684 A1* | 8/2016 | Kamio | H05K 13/0404 |
| 2018/0177088 A1* | 6/2018 | Goto | H05K 13/0452 |

FOREIGN PATENT DOCUMENTS

| CN | 109076728 A | 12/2018 |
| JP | 2010-10496 A | 1/2010 |

(Continued)

OTHER PUBLICATIONS

JP-4887462-B2 translation provided by FIT database (Year: 2024).*
International Search Report mailed on Dec. 3, 2019 in PCT/JP2019/035783 filed on Sep. 11, 2019, 3 pages.

*Primary Examiner* — Aneeta Yodichkas
*Assistant Examiner* — Joshua D Anderson
(74) *Attorney, Agent, or Firm* — Oblon, McClelland, Maier & Neustadt, L.L.P.

(57) ABSTRACT

The component mounter includes a mounting control section that controls a mounting operation for a component by the mounting head based on a control program to execute a mounting process. In a recovery process of attempting to mount a component anew with a mounting position related to the mounting operation as a target position in a case where an error has occurred in the mounting operation, the mounting control section executes the mounting operation for the component by using a designated holder that is one of the multiple holders allocated to the target position in the mounting process as the designated holder.

12 Claims, 7 Drawing Sheets

(51) Int. Cl.
*B25J 15/00* (2006.01)
*H05K 13/04* (2006.01)
*H05K 13/08* (2006.01)

(52) U.S. Cl.
CPC ......... *H05K 13/041* (2018.08); *H05K 13/089* (2018.08); *Y10T 29/53174* (2015.01)

(58) Field of Classification Search
CPC ........... H05K 13/0815; H05K 13/0818; H05K 13/083; H05K 13/089; Y10T 29/4913; Y10T 29/49131; Y10T 29/49133; Y10T 29/53174
See application file for complete search history.

(56) References Cited

FOREIGN PATENT DOCUMENTS

| | | | | |
|---|---|---|---|---|
| JP | 2010-34328 A | | 2/2010 | |
| JP | 4887462 B2 | * | 2/2012 | |
| WO | WO-2016199241 A1 | * | 12/2016 | ......... H05K 13/0452 |
| WO | WO 2019/116540 A1 | | 6/2019 | |

* cited by examiner

Fig. 4

(CONTROL PROGRAM D1)

| No. | MOUNTING POSITION (XY COORDINATES) | MOUNTING ANGLE | COMPONENT TYPE | HOLDER | NOZZLE |
|---|---|---|---|---|---|
| M11 | X11, Y11 | $\theta 11$ | PA | H1 | N1 |
| M12 | X12, Y12 | $\theta 12$ | PA | H2 | N2 |
| M13 | X13, Y13 | $\theta 13$ | PA | H3 | N3 |
| M14 | X14, Y14 | $\theta 14$ | PB | H4 | N4 |
| M15 | X15, Y15 | $\theta 15$ | PB | H1 | N1 |
| M16 | X16, Y16 | $\theta 16$ | PB | H2 | N2 |
| ⋮ | ⋮ | ⋮ | ⋮ | ⋮ | ⋮ |

(CORRECTION DATA D2)

| CORRECTION AMOUNT | |
|---|---|
| XY CALIBRATION VALUE | $\theta$ CALIBRATION VALUE |
| FH1 | FR1 |
| FH2 | FR2 |
| FH3 | FR3 |
| FH4 | FR4 |
| FH5 | FR5 |
| FH6 | FR6 |
| ⋮ | ⋮ |

COMPONENT MOUNTER

TECHNICAL FIELD

The present disclosure relates to a component mounter.

BACKGROUND ART

A component mounter executes a mounting process of mounting a component on a board. In the above mounting process, a pick-and-place cycle (PP cycle) including a pickup operation of picking up a component and a mounting operation of mounting a component on a board is repeatedly executed. When a pickup operation is defective in one PP cycle, a corresponding mounting operation cannot be executed, and thus an error in the mounting operation occurs. In such a case, the component mounter executes a recovery process of attempting the mounting anew at a mounting position skipped due to an error in the mounting operation, for example, in the next and subsequent PP cycles (refer to Patent Literature 1).

PATENT LITERATURE

Patent Literature 1: JP-A-2010-10496

BRIEF SUMMARY

Technical Problem

Incidentally, in the component mounter, for example, a calibration value for each constituent device may be set in order to reduce an operation error inherent to a constituent device of a mounting head that executes a suction operation or a mounting operation. However, in a recovery process, for example, when the mounting head is operated to reduce the required time, since the operation is different from an operation in a case where no error has occurred, there is concern that the above calibration value may not act appropriately and the mounting accuracy may be reduced. In the component mounter, it is demanded to further improve the accuracy of the mounting process.

An object of the present specification is to provide a component mounter capable of improving the mounting accuracy in a mounting process and a recovery process.

Solution to Problem

According to the present specification, there is provided a first component mounter including a moving table configured to be moved in a horizontal direction; multiple holders to which holding members holding picked-up components are respectively attached; a mounting head, provided on the moving table, configured to support the multiple holders to be movable up and down; and a mounting control section configured to control a mounting operation for the components by the mounting head to execute a mounting process based on a control program indicating mounting positions and a mounting order of the components, in which, in a recovery process of attempting to mount a component anew with a mounting position related to the mounting operation as a target position in a case where an error has occurred in the mounting operation, the mounting control section executes the mounting operation for the component by using a designated holder that is one of the multiple holders allocated to the target position in the mounting process as the designated holder.

According to the present specification, there is provided a second component mounter including a moving table configured to be moved in a horizontal direction; a holder to which a holding member holding a picked-up component is attached; a mounting head, provided on the moving table, configured to support the holder to be movable up and down; and a mounting control section configured to control a mounting operation for the component by the mounting head based on a control program indicating a mounting position and a mounting order of the component, and correction data indicating a correction amount set in advance for each mounting position.

Advantageous Effects

With the configuration of the first component mounter, the mounting operation at the target position is executed by using the holder (designated holder) allocated to each mounting position in the mounting process in the recovery process. Consequently, the same mounting conditions as in the mounting process can be obtained, and, for example, the correction amount or the like is applied to the mounting operation for each holder. As a result, it is possible to improve the mounting accuracy in the recovery process. With the configuration of the second component mounter, it is possible to individually reflect the correction amount set in advance in each of the multiple mounting positions. As a result, it is possible to improve the mounting accuracy.

BRIEF DESCRIPTION OF DRAWINGS

FIG. 4 is a diagram illustrating a control program and correction data.

DESCRIPTION OF EMBODIMENTS

1. Outline and Configuration of Component Mounter

Embodiments of a component mounter will be described below with reference to the accompanying drawings. The component mounter configures a production line for producing a board product together with multiple types of board work machines including, for example, other component mounters. Examples of the production line to be used for the board work machine may include a printing machine, an inspection device, and a reflow furnace. A component mounter executes a mounting process of mounting a component on a board.

Figure 1:
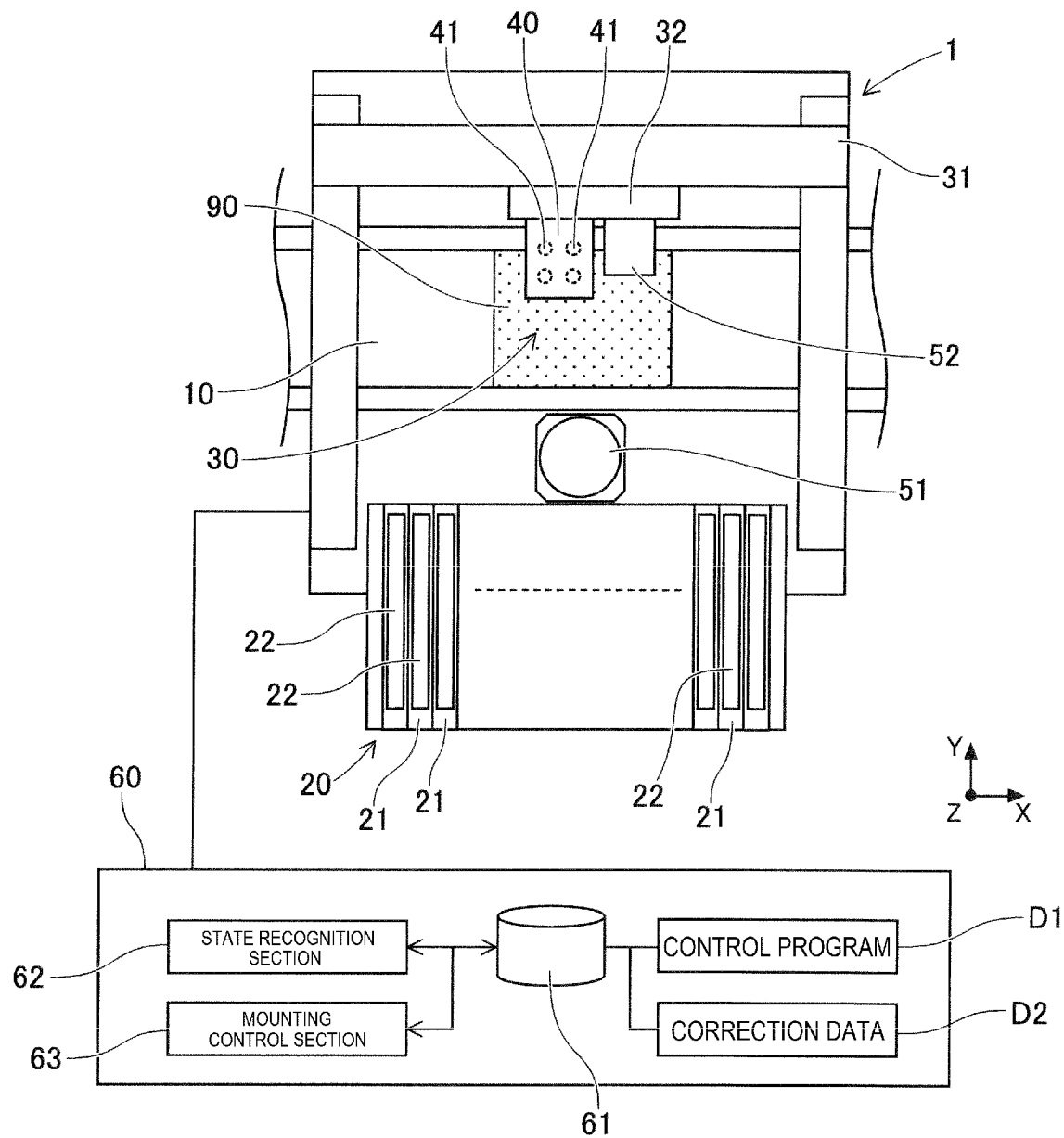
FIG. 1 is a schematic diagram illustrating a configuration of a component mounter of an embodiment.

As illustrated in FIG. 1, component mounter 1 includes board conveyance device 10. Board conveyance device 10 positions board 90 at a predetermined position inside the board work machine together with subsequently conveying boards 90 in a conveyance direction. Component mounter 1 includes component supply device 20. Component supply device 20 supplies components to be mounted on board 90. In component supply device 20, feeder 22 is set in each of multiple slots 21. Feeder 22 feeds and moves a carrier tape housing multiple components and supplies the components such that the components can be picked up.

Component transfer device 30 transfers component 81 supplied by component supply device 20 to a predetermined mounting position on board 90. Component transfer device 30 includes head driving device 31, moving table 32, and mounting head 40. Head driving device 31 moves moving table 32 in a horizontal direction (an X direction and a Y direction) with a linear motion mechanism. Mounting head 40 is detachably provided on moving table 32 by a clamp member (not illustrated).

Figure 2:
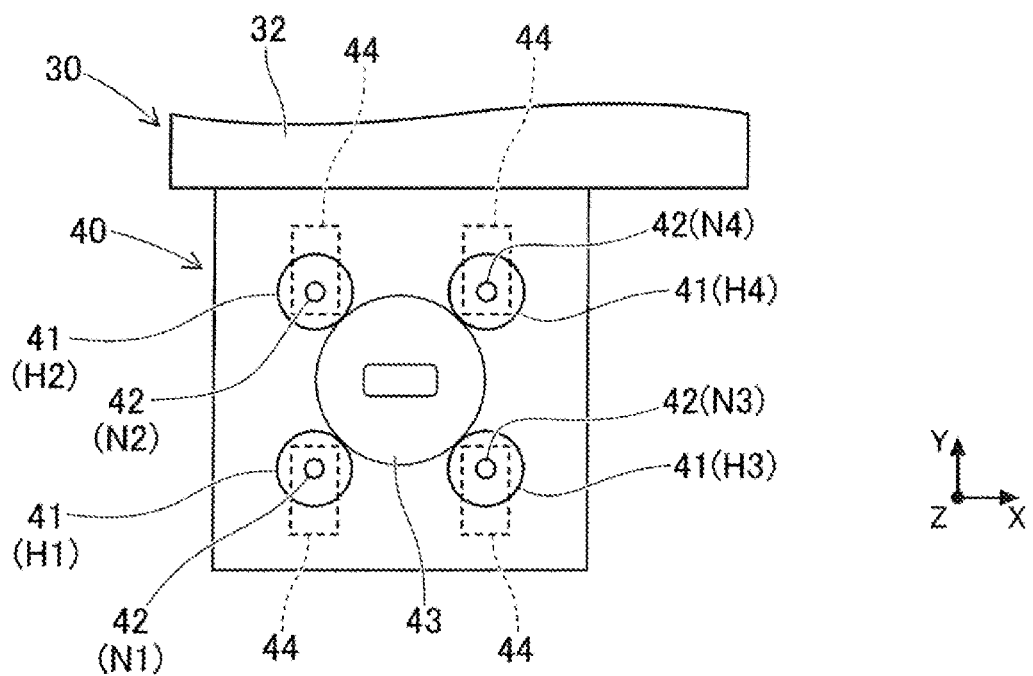
FIG. 2 is a plan view schematically illustrating a configuration of a mounting head.
Figure 3:
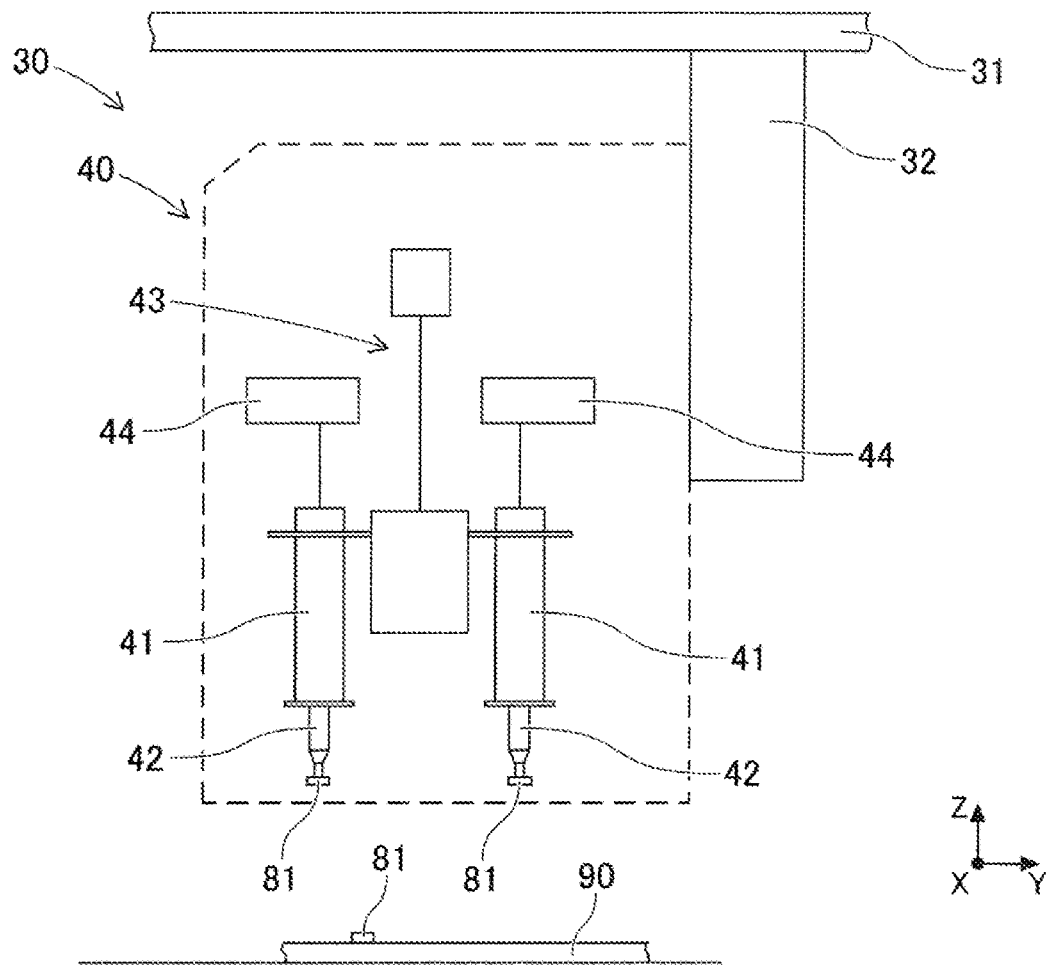
FIG. 3 is a side view schematically illustrating a configuration of the mounting head.

As illustrated in FIGS. 2 and 3, mounting head 40 supports multiple holders 41 to be movable up and down. Each of multiple holders 41 is attached with suction nozzle 42 that holds picked-up component 81. Suction nozzle 42 is a holding member that holds picked-up component 81. Suction nozzle 42 picks up component 81 supplied by feeder 22 by using supplied negative pressure air. As a holding member, a chuck or the like that holds component 81 by gripping component 81 may be employed.

Mounting head 40 includes multiple holders 41 and multiple suction nozzles 42 (four suction nozzles 42 in the present embodiment) at predetermined positions arranged in a matrix. Mounting head 40 includes rotation device 43. Rotation device 43 rotates multiple holders 41 about their respective axes. In the present embodiment, rotation device 43 is shared by multiple holders 41 in rotation thereof. That is, when rotation device 43 drives one of multiple holders 41 as a target, target holder 41 and other holders 41 are also rotated by the same angle in the same direction in cooperation with each other.

Mounting head 40 includes multiple lifting/lowering devices 44. Each of multiple lifting/lowering devices 44 is provided for each of multiple holders 41 to independently lift and lower corresponding holder 41. Suction nozzle 42 is lifted and lowered integrally with holder 41 due to lifting and lowering of holder 41. Mounting head 40 may be of a type for supporting one holder 41 or a type for supporting multiple holders 41 in various manners. In a configuration in which mounting head 40 supports multiple holders 41, mounting head 40 may include multiple rotation devices 43.

Mounting head 40 may arrange multiple holders 41 in multiple rows, for example, four holders 41 in one row. Mounting head 40 may support multiple holders 41 with a rotary head that is provided to be rotatable about an R axis parallel to the vertical axis (Z axis). Multiple holders 41 are disposed on the rotary head at equal intervals in the circumferential direction. Mounting head 40 including the rotary head may share, for example, lifting/lowering device 44 to lift and lower holder 41 indexed to a predetermined position.

Component mounter 1 includes part camera 51 and board camera 52. Part camera 51 and board camera 52 are digital imaging devices having an imaging element such as a CMOS. Part camera 51 and board camera 52 perform imaging based on control signals, and send image data acquired through the imaging. Part camera 51 is configured to be able to image component 81 held by suction nozzle 42 of mounting head 40 from below. Board camera 52 is provided on moving table 32 to be movable in the horizontal direction integrally with mounting head 40. Board camera 52 is configured to image board 90 from above.

Component mounter 1 includes control device 60. Control device 60 is mainly configured with a CPU, various types of memories, and a control circuit. Control device 60 includes storage device 61. Storage device 61 is configured with an optical drive device such as a hard disk device, a flash memory, or the like. Various pieces of data such as control program D1 and correction data D2 used for controlling a mounting process are stored in storage device 61.

As illustrated in FIG. 4, control program D1 indicates a mounting position and a mounting order (M11, M12, . . . ) of component 81 to be mounted on board 90 in the mounting process. The mounting position includes horizontal coordinate values (X11Y11, X12Y12, . . . ) and mounting angles (θ11, θ12, . . . ). Control program D1 includes the type (PA, PB, . . . ) of component 81 to be mounted at the mounting position. Allocation of holders 41 (H1 to H4), allocation of suction nozzles 42 (N1 to N4), and correction data D2 associated with control program D1 will be described in detail later.

Control device 60 includes state recognition section 62. State recognition section 62 executes a recognition process of a holding state of component 81 held by each of the multiple holding members (suction nozzles 42). Specifically, state recognition section 62 performs image processing on image data acquired through imaging of part camera 51, and recognizes a position and an angle of each component 81 with respect to a reference position of mounting head 40. In addition to part camera 51, state recognition section 62 may perform image processing on image data acquired by imaging component 81 from the side, from below, or from above, for example, with a head camera unit provided integrally with mounting head 40.

Control device 60 includes mounting control section 63. Mounting control section 63 controls a mounting operation of mounting head 40 for component 81 based on control program D1, and executes a mounting process. Here, the mounting process includes a process of repeating multiple times a pick-and-place cycle (hereinafter, referred to as a "PP cycle") including a pickup operation of picking up components 81 supplied by component supply device 20 with multiple suction nozzles 42 and a mounting operation of mounting picked-up components 81 at predetermined mounting positions on board 90.

In the mounting process, mounting control section 63 controls an operation of mounting head 40 based on information output from various sensors, a result of the image processing (including a recognition result by state recognition section 62), control program D1, and the like. Consequently, positions and angles of multiple holders 41 and suction nozzles 42 supported by mounting head 40 are controlled.

Here, according to the result of the recognition process by state recognition section 62, in addition to a position and an angle of component 81 with respect to the reference position of mounting head 40, it is also possible to determine whether component 81 is normally picked up in the pickup operation. For example, control device 60 determines that a mounting operation allocated to predetermined suction nozzle 42 in the present PP cycle cannot be executed in a case where predetermined suction nozzle 42 among multiple suction nozzles 42 cannot pick up component 81 (in a case where component 81 is not recognized), in a case where picked-up component 81 is not normal (in a case where a part of component 81 is missing or deformed, or component 81 is in a reversed state).

Mounting control section 63 determines that an error has occurred in a mounting operation in a case where the predetermined mounting operation cannot be executed as described above. Mounting control section 63 sets the mounting operation that cannot be executed as a skip operation to be skipped in a mounting order indicated by control program D1. Not only based on the result of the state recognition process as described above, mounting control section 63 may determine that an error in the mounting operation has occurred but also, for example, in a case of a mounting failure in which the mounting operation has not been normally completed after attempting the mounting operation.

Specifically, also in a case where component 81 falls off from suction nozzle 42 before reaching a mounting position on board 90, or component 81 adheres to the tip of suction nozzle 42 that has attempted mounting, mounting control section 63 determines an error in the mounting operation. In a case where an error as described above has occurred in the mounting operation, mounting control section 63 executes a recovery process of attempting to mount component 81 anew at a mounting position related to a mounting operation (a skip operation, or an operation related to a mounting failure) automatically depending on the type of error, or after an instruction for restarting the process from an operator. Details of the recovery process by mounting control section 63 will be described later.

2. Control Program D1 and Correction Data D2

As described above, control program D1 includes the mounting position and the mounting order of component 81, as illustrated in FIG. 4. In the mounting process using such control program D1, holder 41 used for a mounting operation for component 81 at the mounting position is allocated to each mounting position. The "allocation of holder 41" indicates which holder 41 is applied at each mounting position in the configuration in which mounting head 40 supports multiple holders 41 as in the present embodiment. When predetermined holder 41 is allocated, mounting of component 81 picked up by suction nozzle 42 attached to holder 41 is executed.

The allocation of holder 41 to each mounting position as described above may be of a fixed type set in advance, or may be of an automatic type that is dynamically set according to an environment of the mounting process or the like. In the fixed type of allocation of holder 41, for example, as illustrated in FIG. 4, allocation of holders 41 (L1 to L4) to be applied for each mounting position is included in control program D1. Since suction nozzle 42 is attached to each of multiple holders 41, suction nozzles 42 (N1 to N4) used for the mounting operation are simultaneously allocated in accordance with the allocation of holder 41.

In the automatic type of allocation of holders 41, control device 60 appropriately sets the allocation from the viewpoint of the production efficiency, for example, based on a positional relationship between four holders 41 with respect to the reference position of mounting head 40, a positional relationship between mounting positions, a positional relationship between a supply position of necessary component 81 in the component supply device 20 and mounting head 40, and the like. Consequently, holder 41 is allocated such that, for example, a movement distance of mounting head 40 is shortened according to the current production environment, and thus the production efficiency can be improved. Even if holder 41 is automatically allocated in this manner, the same holder 41 is basically allocated to the same mounting position in different mounting processes unless the production environment or the like is changed.

Here, component mounter 1 executes a calibration process before executing the mounting process. The calibration process is executed in order to absorb an operation error such as an operation error of component transfer device 30. In the above-described calibration process, for example, a pseudo component is generally mounted on a test master board in a predefined operation, and a positional error and an angular error of the pseudo component are calculated. Correction amounts in the XY directions, the Z direction, and the θ direction are set to calibrate an operation of mounting head 40 scheduled to be used in the mounting process. By applying the correction amounts acquired through the calibration process as described above, it is expected that the positional error and the angular error of the component mounted in the mounting process will fall within a certain allowable range.

However, the allowable range becomes smaller in accordance with the demand for higher density and quality improvement of components in a board product, so that component mounter 1 is demanded to improve the mounting accuracy. On the other hand, it has been found that, even if the correction amounts based on the calibration process are applied, an error amount or a directivity of a deviation direction differs for each mounting region, more strictly, for each mounting position in component transfer device 30, as a factor that causes a positional error. Therefore, component mounter 1 of the present embodiment mounts component 81 at the same mounting position as in a mounting process scheduled to be executed, and executes a calibration process based on a result of the mounting.

Through the calibration process as described above, as illustrated in FIG. 4, correction data D2 indicating a correction amount set in advance for each mounting position is acquired. That is, in the mounting process, mounting control section 63 applies a constant correction amount for each mounting position to mount a component in the conventional art, but applies a correction amount set according to correction data D2 for each mounting position to mount a component. Such correction data D2 needs to be generated for each mounting process corresponding to the type of board product, and the number of error detection targets also increases in the calibration process.

However, by using correction data D2 as described above, a positional error and an angular error for each mounting position can be reduced, and thus it is possible to accommodate a narrow allowable range. As a result, it is possible to achieve the high density and quality improvement of components in a board product. Since component mounter 1 of the present embodiment has a configuration in which mounting head 40 is detachable, it is preferable to perform a calibration process unique to mounting head 40. In such an aspect, correction data D2 is generated in accordance with a combination of control program D1 and mounting head 40.

Mounting head 40 of the present embodiment is configured to support multiple holders 41. Therefore, according to the findings as described above, it is assumed that an error amount or a directivity in a deviation direction differs for each of multiple holders 41. Therefore, a mounting process is preferably executed by using a combination of a mounting position in a calibration process performed to obtain correction data D2 and holder 41. Therefore, in a case where a mounting process using correction data D2 indicating a correction amount for each mounting position is executed, it is useful to employ the fixed type in which the allocation of holder 41 is included in control program D1 so that holder 41 is not dynamically allocated to each mounting position.

According to the findings as described above, in the same manner for suction nozzle 42 exchangeably attached to holder 41, it is preferable that suction nozzle 42 used in a calibration process is also allocated to the same mounting position in a mounting process. However, since suction nozzle 42 has a short period of time until maintenance is required or the number of times that can be used for a mounting operation before maintenance is required is small compared with holder 41, suction nozzle 42 is appropriately replaced during production of a board product. Therefore, generating correction data D2 for each combination of constituent devices including suction nozzle 42 may be a factor for increasing the time required for the setup. Therefore, it is preferable to execute an appropriate calibration process based on a relationship between the required accuracy for a board product and an allowable production time to appropriately generate correction data D2.

In the present embodiment, as illustrated in FIG. 4, the correction amount of correction data D2 includes an XY calibration value in the horizontal direction calculated based on a positional error of an actual mounting position (corresponding to a position where a component is actually mounted in a calibration process) with respect to an ideal mounting position (corresponding to a mounting position in design). The correction amount of correction data D2 includes a θ calibration value about the vertical axis calculated based on an angular error of an actual mounting angle (corresponding to an angle at which a component is actually mounted in a calibration process) with respect to an ideal mounting angle (corresponding to a mounting angle in design) at a mounting position.

Correction data D2 may indicate a correction amount for each of at least some of the mounting positions included in control program D1, or may indicate a correction amount for each of all the mounting positions. From the viewpoint of improvement of the mounting accuracy, it is preferable that the correction amount for each of all the mounting positions is included in correction data D2. However, actually, the required accuracy may differ depending on the type or a mounting region of component 81 on board 90. Therefore, correction data D2 may include individual correction amounts applied only to the type of component 81 having particularly high required accuracy or a mounting position corresponding to a mounting region, and may additionally include general correction amounts applied to other mounting positions.

Correction data D2 is generated through, for example, the calibration process as described above. Correction data D2 may be appropriately edited in consideration of a result of the subsequent calibration process further executed. Correction data D2 may be adjusted by performing image processing on image data acquired through imaging of mounted component 81 using, for example, board camera 52 after a mounting process is executed and by using an actual mounting state analyzed based on a result of the image processing.

3. Mounting Process by Component Mounter 1

Figure 5:
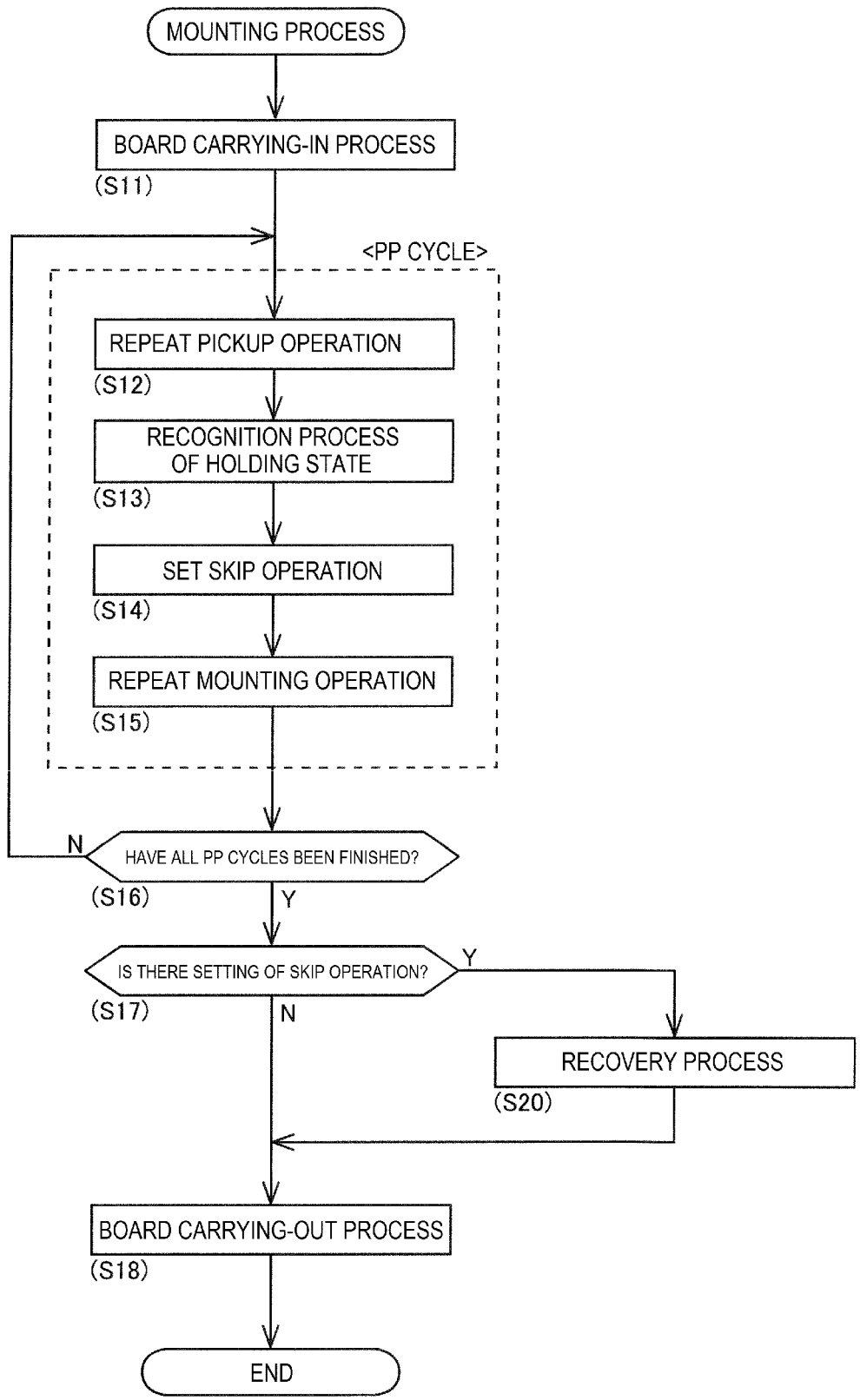
FIG. 5 is a flowchart illustrating a mounting process by the component mounter.

The mounting process by component mounter 1 will be described with reference to FIGS. 4 and 5. First, as illustrated in FIG. 5, board conveyance device 10 of component mounter 1 executes a carrying-in process of board 90 (S11). Consequently, board 90 is carried into the machine and positioned at a predetermined position in the machine. Next, mounting control section 63 executes a PP cycle.

In the PP cycle, mounting control section 63 repeatedly executes a pickup operation of picking up components by using multiple suction nozzles 42 (S12). In this pickup operation (S12), as illustrated in FIG. 4, mounting control section 63 controls an operation of mounting head 40 such that component 81 is picked up by using holders 41 (H1 to H4) allocated to respective mounting positions in control program D1 and suction nozzles 42 (N1 to N4) attached to respective holders 41.

Subsequently, state recognition section 62 executes a recognition process of a holding state of the component held by each of multiple suction nozzles 42 (S13). Specifically, control device 60 moves mounting head 40 above part camera 51, and sends an imaging command to part camera 51. State recognition section 62 performs image processing on image data acquired through the imaging of part camera 51 to recognize a posture (a position and an angle) of the component held by each of multiple suction nozzles 42.

Mounting control section 63 sets a skip operation based on a result of the recognition process (S13) (S14). Specifically, mounting control section 63 determines, based on the result of the recognition process (S13), whether each of one or more suction nozzles 42 that have attempted to pick up the component among multiple suction nozzles 42 appropriately holds the component. Specifically, mounting control section 63 determines that the mounting operation by the predetermined suction nozzle 42 cannot be executed in a case where a component is not picked up by predetermined suction nozzle 42, a case where the picked-up component is inclined with respect to the vertical axis, a case where the component is held in a reversed state, or the like.

Figure 7:
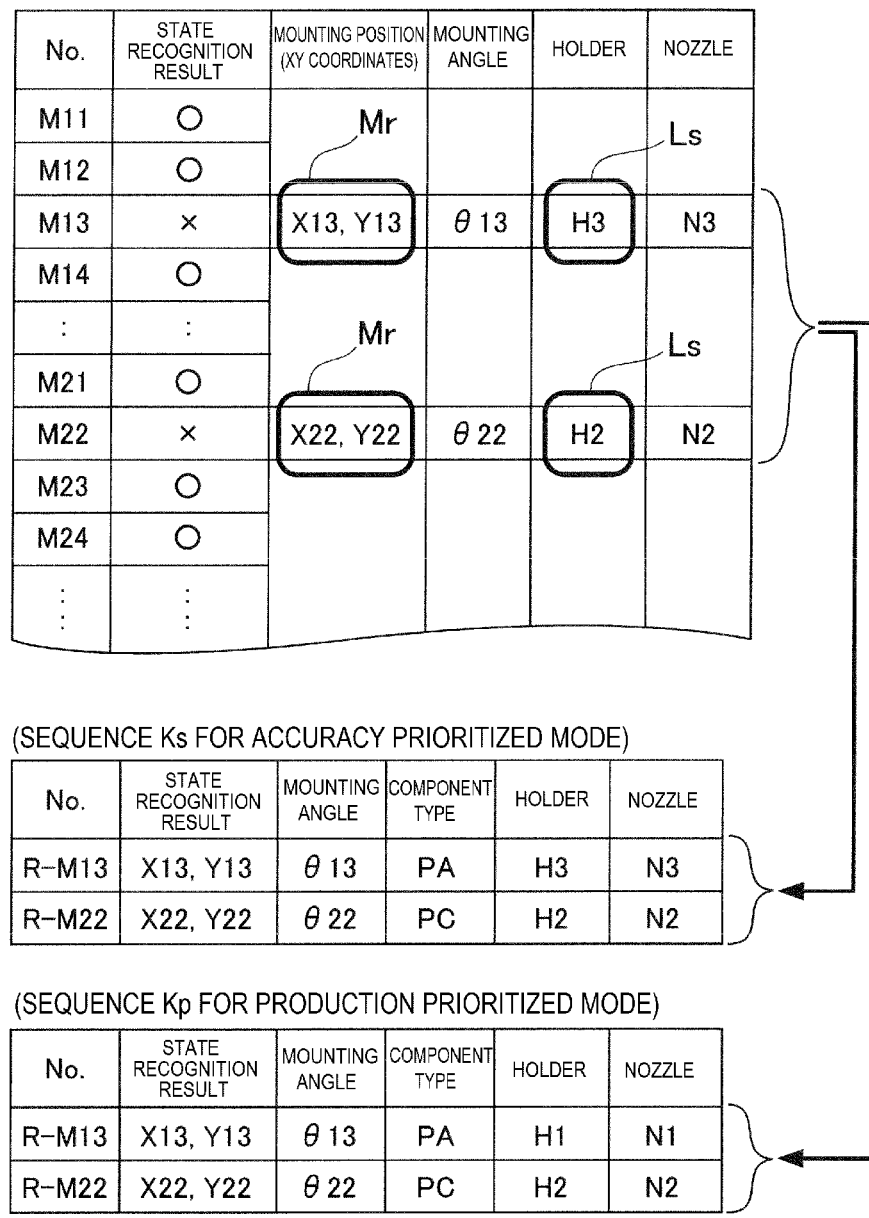
FIG. 7 is a diagram illustrating a relationship between the occurrence of an error in a mounting operation in the mounting process and a PP cycle in the recovery process.

In a case where a mounting operation allocated to predetermined suction nozzle 42 cannot be executed, mounting control section 63 determines that an error has occurred in the mounting operation that requires execution of a subsequent recovery process, and sets the mounting operation as a skip operation. Specifically, for example, as illustrated in FIG. 7, in a case where a mounting operation by third suction nozzle 42 (N3) among four suction nozzles 42 cannot be executed, mounting control section 63 sets a mounting operation to the mounting position (X13Y13) related to the mounting operation as a skip operation. In a case where no error has occurred in the mounting operation, mounting control section 63 sets a mounting operation to be set as a skip operation in the present PP cycle to 0.

Subsequently, mounting control section 63 repeatedly executes a mounting operation of mounting the component by using multiple suction nozzles 42 (S15). In the mounting operation (S15), mounting control section 63 controls an operation of mounting head 40 such that component 81 is mounted by using holders 41 (H1 to H4) allocated to the respective mounting positions in control program D1. Mounting head 40 controls an operation of mounting head 40 such that holder 41 and suction nozzle 42 are positioned and angled at the mounting position based on the result of the recognition process (S13) and the correction amount set for each mounting position in correction data D2.

Mounting control section 63 may employ the following control mode in order to further improve the mounting accuracy when the above mounting operation using correction data D2 is executed. Specifically, when a mounting operation for component 81 is executed by applying the correction amount indicated by correction data D2, mounting control section 63 may move mounting head 40 at a movement speed of mounting head 40 operated in order to calculate the XY calibration value in the calibration process. Consequently, it is possible to perform correction in consideration of characteristics of a positioning error in a linear motion mechanism of head driving device 31 (for example, backlash occurrence characteristics).

In a case where a mounting operation for component 81 is executed by applying the correction amount, mounting control section 63 may rotate holder 41 at a rotation speed of holder 41 operated in order to calculate the θ calibration value in the calibration process. Consequently, it is possible to perform correction in consideration of characteristics of an angle determination error in rotation device 43 of mounting head 40. Therefore, it is possible to further improve the mounting accuracy by employing the above control mode.

Mounting control section 63 determines whether all of the PP cycles have been finished based on control program D1 (S16). In a case where all of the PP cycles have not been completed (S16: No), mounting control section 63 repeatedly executes the PP cycles (S12 to S15). In a case where all of the PP cycles have been finished (S16: Yes), mounting control section 63 determines whether there is a skip operation in the executed PP cycle (S17). In a case where there is one or more skip operations (S17: Yes), mounting control section 63 executes a recovery process in which the skip operations are gathered (S20). Details of the recovery process will be described later.

After the recovery process (S20) is finished or in a case where there is no skip operation in the executed PP cycle (S17: No), control device 60 executes a carrying-out process of board 90 (S18). In the carrying-out process of board 90, board conveyance device 10 unclamps board 90 that has been positioned, and carries out board 90 to the outside of component mounter 1. According to the configuration as described above, it is possible to individually reflect a correction amount set in advance for each of multiple mounting positions. As a result, it is possible to improve the mounting accuracy.

4. Recovery Process by Component Mounter 1

A mounting process by component mounter 1 will be described with reference to FIGS. 4 and 6 to 8. In a case where an error has occurred in a mounting operation, mounting control section 63 executes a recovery process in a mounting process. Here, it is assumed that the recovery process is not executed every PP cycle, but the recovery process in which one or more skip operations (mounting operations determined as not being executable) are gathered is executed after all the PP cycles are finished. Here, it is assumed that two skip operations (M13, M22) have occurred in the mounting process, as illustrated in FIG. 7.

Figure 6:
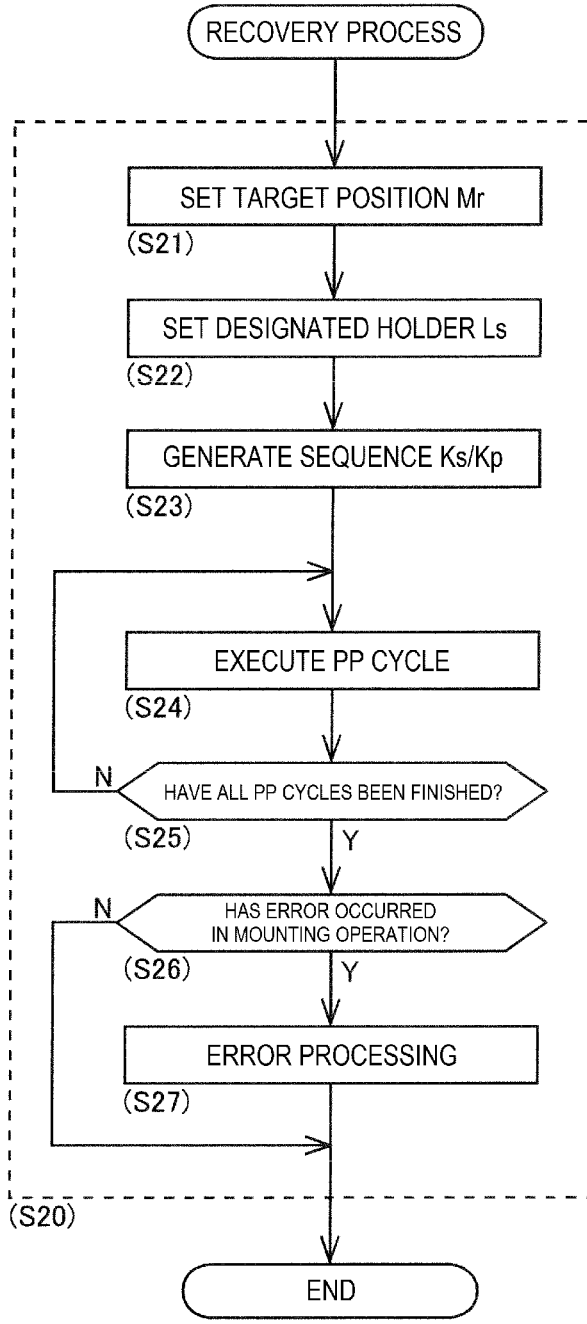
FIG. 6 is a flowchart illustrating a recovery process in the mounting process.

As illustrated in FIG. 6, mounting control section 63 sets a mounting position related to a mounting operation in which one or more errors have occurred as a target position (S21). Specifically, as illustrated in FIG. 7, mounting control section 63 sets respective mounting positions (X13Y13, X22Y22) related to the skip operations (M13, M22) in control program D1 as target positions Mr. Next, mounting control section 63 sets one (H3, H2) allocated to target position Mr in the mounting process among multiple holders 41 (H1 to H4) as designated holder Ls (S22).

Subsequently, mounting control section 63 generates a sequence related to the PP cycle in the recovery process (S23). In this case, mounting control section 63 generates a sequence corresponding to an operation mode set in the mounting process. The above operation mode includes an accuracy prioritized mode and a production prioritized mode. The accuracy prioritized mode is an operation mode for executing a mounting operation for component 81 by using designated holder Ls in the recovery process. The production prioritized mode is an operation mode for selecting holder 41 used for the mounting operation for component 81 from among multiple holders 41 (H1 to H4) based on the required time in the recovery process.

In the case of the accuracy prioritized mode, as illustrated in FIG. 7, mounting control section 63 reallocates holder 41 that is the same as in the mounting process in the recovery process to target position Mr, and generates sequence Ks for executing a pickup operation and a mounting operation for component 81 by using designated holder Ls. in the case of the production prioritized mode, as illustrated in FIG. 7, mounting control section 63 allocates holder 41 to target position Mr such that the time required for the recovery process is reduced, and generates sequence Kp for executing a pickup operation and a mounting operation for component 81 by using holder 41.

Mounting control section 63 can switch between the accuracy prioritized mode and the production prioritized mode in various aspects. For example, mounting control section 63 may perform switching based on at least one of target position Mr, the type of component 81 to be mounted at target position Mr, and the type of board product to be produced. That is, mounting control section 63 may individually switch between the operation modes according to a mounting region or the component type having high required accuracy. The operation modes may be switched between every corresponding mounting process such as a board product or every control program D1. In the following description, it is assumed that the accuracy prioritized mode is selected.

Mounting control section 63 executes a PP cycle based on sequence Ks generated in step S23 (S24). This PP cycle is the same as the normal PP cycle (S12 to S15 in FIG. 5) in the mounting process. Here, target position Mr in the recovery process is a mounting value corresponding to a mounting error that accidentally occurred in a normal PP cycle in the mounting process. Therefore, in the recovery process, mounting positions before and after target position Mr are naturally different from those in the normal PP cycle.

Correction data D2 is generated based on a positional error or the like acquired by performing a mounting operation at a mounting position indicated by control program D1 in a predefined mounting order in the calibration process. Thus, it has been found that when applying correction data D2 in the PP cycle (S24) in the recovery process, it is possible to further improve the accuracy by performing a mounting operation in the same manner as in a situation in which the mounting operation is normally performed at target position Mr in the normal PP cycle (S12 to S15). Therefore, mounting control section 63 of the present embodiment employs the following control mode for a mounting operation in the recovery process.

Figure 8:
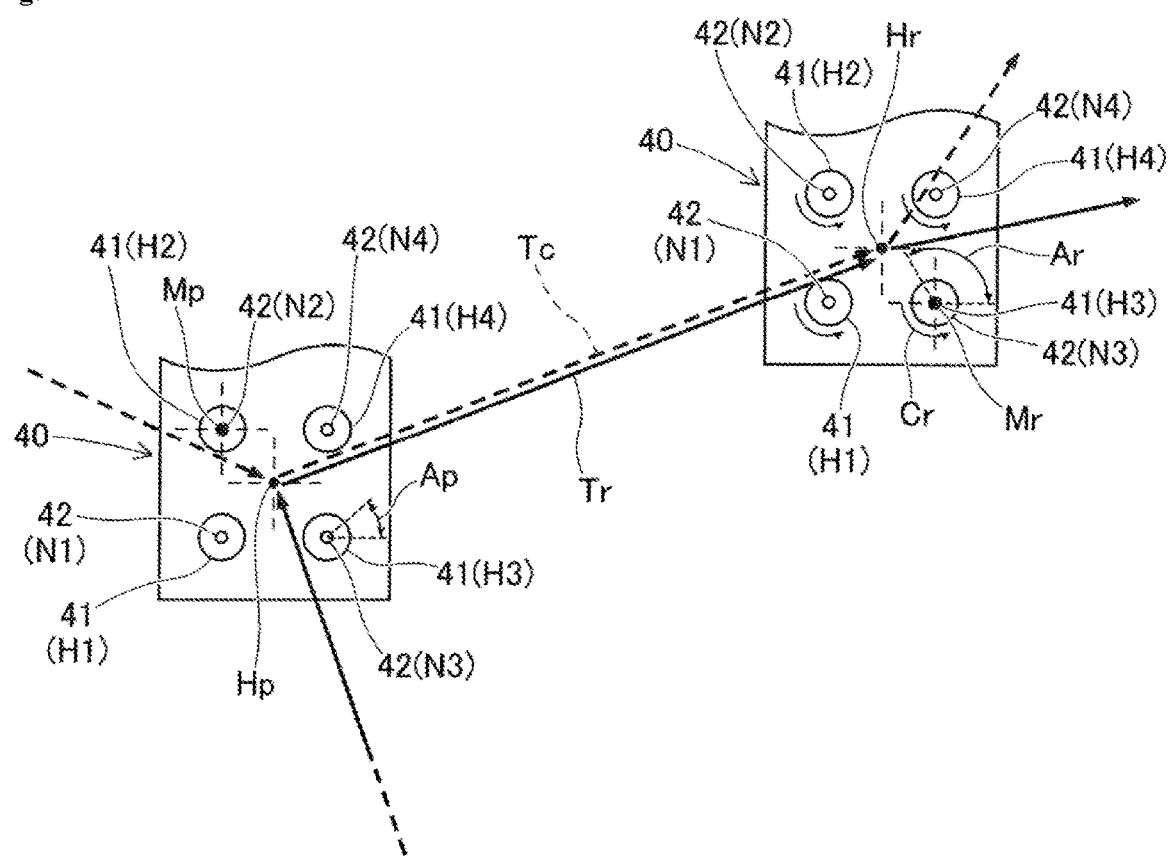
FIG. 8 is a schematic diagram illustrating movement of the mounting head in the recovery process.

Specifically, as illustrated in FIG. 8, when designated holder Ls is positioned at target position Mr in the recovery process, mounting control section 63 moves mounting head 40 to recovery head position Hr along at least a part, in which recovery head position Hr is a terminal end, of movement trajectory Tr from immediately preceding head position Hp to recovery head position Hr. "Immediately preceding head position Hp" is a position of mounting head 40 that executes a mounting operation at mounting position Mp immediately before target position Mr in the mounting order in control program D1. "Recovery head position Hr" is a position of mounting head 40 that executes a mounting operation at target position Mr in the recovery process.

That is, mounting control section 63 moves mounting head 40 in the same manner as in at least partial approach of mounting head 40 (movement trajectory Tc indicated by dashed lines in FIG. 8) performed with respect to target position Mr in a case where no error occurs in the mounting operation in the normal PP cycle. In this case, a length along which mounting head 40 is moved may be freely set, but the longer movement trajectory Tr, the more preferable from the viewpoint of improvement in accuracy. Mounting head 40 may be moved along movement trajectory Tr over the entire length of movement trajectory Tr.

In other words, mounting control section 63 moves mounting head 40 in the following order. That is, in the recovery process, first, mounting control section 63 positions holder 41 allocated to mounting position Mp in a mounting process at mounting position Mp immediately before target position Mr in the mounting order in control program D1. Next, mounting control section 63 moves mounting head 40 such that designated holder Ls is positioned at target position Mr.

In addition to the above, mounting control section 63 may employ the following control mode related to rotation of holder 41. Specifically, when designated holder Ls is angled at target position Mr in the recovery process, mounting control section 63 rotates rotation device 43 to rotate designated holder Ls in rotational direction Cr defined by immediately preceding holder angle Ap and recovery holder angle Ar.

"Immediately preceding holder angle Ap" is an angle of holder 41 corresponding to a mounting angle at mounting position Mp immediately before target position Mr in the mounting order in control program D1. "Recovery head position Hr" is an angle of holder 41 corresponding to a mounting angle at target position Mr in the recovery process. That is, mounting control section 63 rotates rotation device 43 to perform the same operation as at least a part of a rotation operation of holder 41 performed at target position Mr in a case where no error has occurred in the mounting operation in the normal PP cycle.

Mounting control section 63 applies the correction amount set for target position Mr in correction data D2 when executing a mounting operation for component 81 by using designated holder Ls in the recovery process. That is, mounting control section 63 executes the mounting operation using designated holder Ls when executing the PP cycle based on sequence Ks for the accuracy prioritized mode. In this case, mounting control section 63 applies correction data D2 indicating the correction amount for each mounting position, and reflects the correction amount set for target position Mr in the mounting operation.

Mounting control section 63 is configured to improve the mounting accuracy according to the control mode as described above. Mounting control section 63 may apply a control mode related to movement of mounting head 40 and rotation of holder 41 employed in the normal PP cycle to the recovery process. Specifically, when executing a mounting operation for component 81 by applying the correction amount indicated by correction data D2, mounting control section 63 moves mounting head 40 at a movement speed of mounting head 40 operated in order to calculate the XY calibration value in the calibration process. When executing a mounting operation for component 81 by applying the correction amount, mounting control section 63 rotates holder 41 at a rotation speed of holder 41 operated in order to calculate the θ calibration value in the calibration process.

Mounting control section 63 determines whether all of the PP cycles have been finished based on sequence Ks (S25). In a case where all of the PP cycles have not been completed (S25: No), mounting control section 63 repeatedly executes the PP cycles (S24). In a case where all of the PP cycles have been finished (S25: Yes), mounting control section 63 determines whether an error has occurred in the mounting operation in the executed PP cycle (S26). That is, in the PP cycle (S24) of the recovery process, for example, in a case where a skip operation is set on the assumption that a part of the mounting operation cannot be executed, mounting control section 63 assumes that an error has occurred in the mounting operation.

In a case where an error has occurred in the mounting operation (S26: Yes), mounting control section 63 executes error processing (S27). Specifically, mounting control section 63 may execute, for example, a recovery process again as the error processing. As the error processing, mounting control section 63 may notify an operator that maintenance is necessary, for example, in a case where the number of times of executing the recovery process with respect to the same mounting position has reached a predefined number of times. After the error processing (S27) is executed, or in a case where no error has occurred in the mounting operation in the PP cycle (S26: No), mounting control section 63 finishes the recovery process.

With the configuration as described above, a mounting operation at target position Mr is executed by using holder 41 (designated holder Ls) allocated to each mounting position in the mounting process in the recovery process (S20). Consequently, the same mounting conditions as in the mounting process can be obtained, and, for example, a correction amount or the like set for each holder 41 is applied to the mounting operation. As a result, it is possible to improve the mounting accuracy in the recovery process.

5. Modification Aspects of Embodiment

In the embodiment, as the control mode in the PP cycle (S24) of the recovery process, mounting head 40 is moved or rotation device 43 is rotated in the same manner as in a case where an error in the mounting operation has not occurred. The control mode as described above may be similarly applied when a skip operation is set in a normal PP cycle.

Specifically, for example, in a normal PP cycle, it is determined that a predetermined mounting operation cannot be executed based on a result of state recognition of component 81, and mounting control section 63 sets the mounting operation as a skip operation. In this case, in accordance with the setting of the skip operation, mounting head 40 is moved from a mounting position (hereinafter, a first position) related to a mounting operation immediately before the skip operation to a mounting position (hereinafter, a second position) related to a mounting operation immediately after the skip operation.

In this case, a movement trajectory of mounting head 40 from the first position to the second position differs from the movement trajectory of mounting head 40 in a calibration process unless mounting head 40 passes through a mounting position (target position) related to the skip operation. Therefore, in a case where the skip operation is set in the normal PP cycle, for example, mounting control section 63 does not execute a mounting operation at the target position, but may approach the second position via the target position to rotate rotation device 43 in a predefined rotational direction.

Consequently, the operation of mounting head 40 in the PP cycle and the rotation of rotation device 43 are executed in the same manner as in execution of the calibration process executed in order to generate correction data D2. Therefore, correction data D2 is more preferably reflected in a mounting operation. As a result, it is possible to improve the mounting accuracy.

REFERENCE SIGNS LIST

1: Component mounter, 30: Component transfer device, 31: Head driving device, 32: Moving table, 40: Mounting head, 41: Holder, 42: Suction nozzle (holding member), 43: Rotation device, 44: Lifting/lowering device, 60: Control device, 61: Storage device, 62: State recognition section, 63:

Mounting control section, 81: Component, 90: Board, D1: Control program, D2: Correction data, FH1: XY calibration value, FR1: θ calibration value, Hp: Immediately preceding head position, Hr: Recovery head position, Ls: Designated holder, Mp: immediately preceding mounting position, Mr: Target position, Tc, Tr: Movement trajectory, Cr: Rotational direction

The invention claimed is:

1. A component mounter comprising:
a moving table configured to be moved in a horizontal direction;
multiple holders to which holding members holding picked-up components are respectively attached;
a mounting head, provided on the moving table, configured to support the multiple holders to be movable up and down; and
a mounting control section configured to control a mounting operation for the components by the mounting head to execute a mounting process based on a control program indicating mounting positions and a mounting order of the components,
wherein after the mounting operation for the components is finished, the mounting control section is configured to perform a recovery process when an error has occurred in the mounting operation, the recovery process including:
setting a mounting position in which the mounting of a component has the error as a target position,
setting a holder in which the mounting of the component has the error as a designated holder,
selecting between an accuracy prioritized mode in which a mounting operation of a component for the recovery process is executed by using the designated holder and a production prioritized mode in which the holder used for the mounting operation of a component for the recovery process is selected from among the multiple holders to reduce a time required in the recovery process, and
performing the mounting operation of the recovery process using the selected accuracy prioritized mode or the selected production prioritized mode to attempt to mount a component in the target position.

2. The component mounter according to claim 1, wherein
a position of the mounting head that executes a mounting operation at a mounting position immediately before the target position in the mounting order in the control program is defined as an immediately preceding head position,
a position of the mounting head that executes the mounting operation at the target position in the recovery process is defined as a recovery head position, and
when the designated holder is positioned at the target position in the recovery process when the accuracy prioritized mode is selected, the mounting control section moves the mounting head along a movement trajectory from the immediately preceding head position to the recovery head position.

3. The component mounter according to claim 1, wherein
in the recovery process when the prioritized mode is selected, the mounting control section positions a holder allocated to a mounting position immediately before the target position in the mounting operation at the mounting position immediately before the target position in the mounting order in the control program, and moves the mounting head such that the designated holder is positioned at the target position.

4. The component mounter according to claim 1, wherein
the mounting head has a rotation device configured to rotate the multiple holders about respective axes,
an angle of a holder allocated to a mounting position immediately before the target position corresponding to a mounting angle at a mounting position immediately before the target position in the mounting order in the control program is defined as an immediately preceding holder angle,
an angle of the holder allocated to the mounting position immediately before the target position corresponding to a mounting angle at the target position in the recovery process is defined as a recovery holder angle, and
when the designated holder is angled at the target position in the recovery process, the mounting control section rotates the rotation device to rotate the designated holder in a rotational direction defined by the immediately preceding holder angle and the recovery holder angle.

5. The component mounter according to claim 1, wherein
the selection between the accuracy prioritized mode and the production prioritized mode being based on at least one of the target position, a type of the component to be mounted at the target position, or a type of a board product to be produced.

6. The component mounter according to claim 1, wherein
the control program includes allocation of the holder to be used for each of the multiple mounting positions in the mounting operation.

7. The component mounter according to claim 1, wherein
the mounting control section controls the mounting operation for the component by the mounting head based on the control program and correction data indicating a correction amount set in advance for each mounting position, and
the mounting control section applies the correction amount set for the target position based on the correction data when the mounting operation for the component is executed by using the designated holder in the recovery process.

8. The component mounter according to claim 7, wherein
the correction amount includes an XY calibration value in the horizontal direction calculated based on a positional error of an actual mounting position with respect to an ideal mounting position.

9. The component mounter according to claim 8, wherein
the mounting control section calculates the XY calibration value when the mounting operation for the component is executed by applying the correction amount.

10. The component mounter according to claim 7, wherein
the correction amount includes a θ calibration value about a vertical axis calculated based on an angular error of an actual mounting angle with respect to an ideal mounting angle at the mounting position.

11. The component mounter according to claim 10, wherein
the mounting control section calculates the θ calibration value when the mounting operation for the component is executed by applying the correction amount.

12. The component mounter according to claim 7, wherein
   the mounting head is detachably provided on the moving table, and
   the correction data is generated in accordance with a combination of the control program and the mounting head.

* * * * *